United States Patent [19]

Takahashi

[11] Patent Number: 5,656,812
[45] Date of Patent: Aug. 12, 1997

[54] ELECTRON PROBE MICROANALYZER AND X-RAY ANALYSIS USING SAME

[75] Inventor: Hideyuki Takahashi, Tokyo, Japan

[73] Assignee: Jeol Ltd., Tokyo, Japan

[21] Appl. No.: 684,448

[22] Filed: Jul. 19, 1996

[51] Int. Cl.$^6$ ................................................. H01J 37/256
[52] U.S. Cl. ............................................................. 250/310
[58] Field of Search .................................. 250/310, 305, 250/306, 307

[56] References Cited

U.S. PATENT DOCUMENTS

| 5,001,344 | 3/1991 | Kato et al. | 250/310 |
| 5,128,545 | 7/1992 | Komi | 250/310 |

OTHER PUBLICATIONS

Japanese Published Patent Application No. 59–151739 entitled "Sample Movement in X–Ray Microanalyzer", Yoshitaka Nagatsuka, published Aug. 30, 1984.

Primary Examiner—Kiet T. Nguyen
Attorney, Agent, or Firm—Webb Ziesenheim Bruening Logsdon Orkin & Hanson, P.C.

[57] ABSTRACT

An electron probe microanalyzer is capable of easily carrying out a precise x-ray analysis of a specimen whose surface is not flat or smooth, by satisfying the focusing conditions. A region to be analyzed on the specimen surface is divided into a given number of subregions by division lines. The heights, or z-coordinates, of the intersections of the division lines are measured. The z-coordinates are stored in a memory, together with their x- and y-coordinates. A unit plane approximating each subregion is determined from the x-, y-, and z-coordinates of the intersections. A plurality of analysis points are established in each determined unit plane. The heights of the analysis points are calculated, using a mathematical formula which defines the positions of the analysis points and the unit planes. In making an x-ray analysis of each analysis point, heights of the specimen are determined from the calculated z-coordinates.

12 Claims, 5 Drawing Sheets

ELECTRON PROBE MICROANALYZER AND X-RAY ANALYSIS USING SAME

FIELD OF THE INVENTION

The present invention relates to an electron probe microanalyzer (EPMA) for analyzing specimens, using an electron beam and, more particularly, to an electron probe microanalyzer capable of accurately analyzing specimens even if their surfaces are uneven.

BACKGROUND OF THE INVENTION

In an electron probe microanalyzer (EPMA) using a wavelength-dispersive spectrometer (WDS), the specimen, the analyzer crystal, and the spectrometer are required to be placed on the Rowland circle at a higher accuracy so as to satisfy the focusing conditions for x-ray detection than in an electron probe microanalyzer employing an energy-dispersive spectrometer (EDS). Of the specimen, analyzer crystal, and spectrometer, a detection system comprising the analyzer crystal and spectrometer is moved by an integral mechanism. However, the specimen stage on which the specimen is placed is moved horizontally and vertically, tilted, and rotated independent of the detection system, because the stage determines the position on the specimen to be analyzed. This function of moving the specimen stage independent of the detection system is required not only in x-ray analysis but also in SEM involving specimen surface morphology observation and elemental analysis making use of reflected electrons.

When an x-ray analysis is made, a point or region to be analyzed is determined with an SEM image or the like. Then, the x- and y-coordinates of the specimen stage and its height are adjusted so that an arbitrary analysis point within this analyzed region is brought to a point where the focusing conditions are met, i.e., an analysis point. At this time, the alignment in the direction of the height of the specimen stage is often made, using an optical microscope.

Analyses using an electron probe microanalyzer are classified into (1) point-by-point analysis in which an analysis is performed whenever a point is selected appropriately and (2) mapping analysis in which a set of points is established within an analyzed region and the points are sequentially analyzed automatically. In the case of the point-by-point analysis, whenever a point is selected, the height is set. On the other hand, in the case of the mapping analysis, there exist a number of points to be analyzed. Therefore, it is difficult to set the height at every point because of complexity of the work and because it takes a long time to perform the work.

Accordingly, it is common practice to adopt the following technique. It is assumed that the whole specimen surface is flat and smooth. The heights, for example, of the specimen at the four corners are measured. The tilt of the specimen surface is found. The heights of every analysis point used for a mapping analysis are established, taking account of the tilt. In this way, if the specimen has a flat and smooth surface as a whole, an accurate analysis can be performed. However, it is sometimes necessary to make analyses of specimens having greatly uneven surfaces. If the heights used for the analysis are determined by the aforementioned method, the height may differ among the analysis points because of the unevenness. Therefore, in the case of a specimen having a rough surface, the focusing conditions are not satisfied according to the analysis point. Consequently, sufficient x-ray intensities may not be obtained.

Therefore, where a mapping analysis is made of a specimen having a rough surface, the rough surface is smoothed by a polishing operation using feather cloth prior to the analysis. However, in practice, there exist numerous specimens which cannot be smoothed. If such a specimen incapable of being smoothed is analyzed with an electron probe microanalyzer without sufficient care, then an elemental distribution deviating from the actual distribution may be observed. In this way, there is the possibility that the analysis results in serious errors.

With respect to specimens having steps, the focusing conditions may not be satisfied, in the same way as in the case of specimens having rough surfaces. Hence, sufficient x-ray intensities may not be produced.

Where mapping analyses are performed by the prior art techniques in this way, it is difficult to perform accurate analyses of specimens having uneven surfaces, i.e., having irregularities and steps.

SUMMARY OF THE INVENTION

The present invention has been made in view of the foregoing situations.

It is an object of the present invention to provide a method and apparatus for easily and accurately accomplishing an electron microprobe analysis even if the surface of the analyzed specimen is not flat or smooth, by satisfying the focusing conditions.

One embodiment of the present invention lies in an x-ray analysis method using an electron probe microanalyzer for directing an electron beam at a specimen and detecting characteristic x-rays emanating from the specimen by a spectrometer to make an elemental analysis of the specimen surface. This method comprises the steps of: (a) specifying a region to be analyzed on the specimen surface; (b) dividing the specified analyzed region into a plurality of subregions by division lines; (c) finding information about heights (z-coordinates) of intersections of said division lines defining said subregions and storing the information in a memory together with x- and y-coordinates of the intersections; (d) establishing a plurality of analysis points within each of the subregions, finding x-, y-, and z-coordinates of intersections surrounding each of said subregions, and finding z-coordinates of the analysis points from the x- and y-coordinates of the analysis points; and (e) determining heights of the specimen according to the found z-coordinates and making an x-ray analysis of each analysis point while substantially satisfying focusing conditions for the spectrometer.

Another embodiment of the invention lies in an electron probe microanalyzer for directing an electron beam at a specimen and detecting characteristic z-rays emanating from the specimen by a spectrometer to make an elemental analysis of a surface of the specimen, said microanalyzer comprising: an observation means for producing a visible image to a user to observe the specimen surface; a position-specifying means permitting the user to specify a region to be analyzed on the specimen surface within the visible image produced by the observation means; a division means for dividing the specified region into a plurality of subregions by division lines; a height-measuring means for measuring heights, or z-coordinates, of a plurality of intersections created by the division lines; a means for bringing the intersections successively into a position where the heights are measured by the height-measuring means; a storage means for storing information about x- and y-coordinates of the intersections and information about the heights measured by the height-measuring means; an arithmetic means for finding information about heights of the analysis points from the information about positions of the analysis points and from the information about the heights of intersections surrounding each subregion when an x-ray analysis is made of each of the analysis points established within each subregion; and a height-establishing means for establishing heights of the specimen according to the found information about the heights of the analysis points so that the heights of the analysis.points substantially satisfy focusing conditions for the spectrometer.

Other objects and features of the invention will appear in the course of the description thereof, which follows.

DETAILED DESCRIPTION OF THE INVENTION

Figure 1:
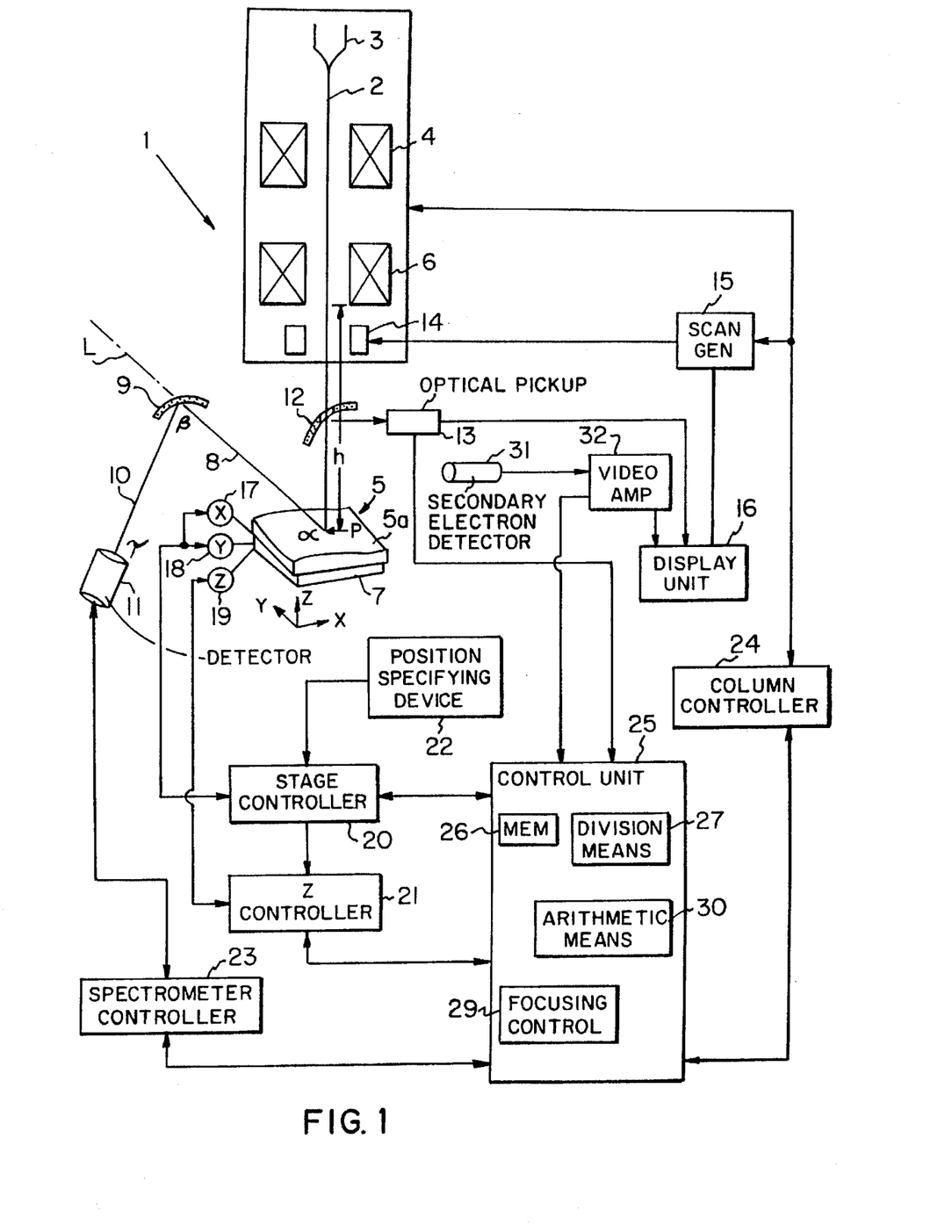
FIG. 1 is a schematic block diagram of an electron probe microanalyzer according to the invention.

Referring to FIG. 1, there is shown an electron probe microanalyzer (EPMA) embodying the concept of the present invention. This microanalyzer, generally indicated by reference numeral 1, has a filament 3 producing an electron beam 2. This electron beam 2 is finely focused onto a surface of a specimen 5 via a condenser lens 4 and an objective lens 6, the specimen 5 being placed on a specimen stage 7. X-rays 8 are produced from the illuminated point of the specimen 5 and analyzed by an x-ray spectrometer consisting of an analyzer element 9 and a detector 11 for detecting x-rays 10 in a certain wavelength range extracted by the analyzer element 9. This analyzer element 9 consists of a crystal grating for dispersing the incoming x-rays in terms of wavelengths.

A reflecting mirror 12 is positioned between the specimen 5 and the objective lens 6 and provided with an electron beam passage hole. The mirror 12 acts to reflect light reflected off the specimen 5 in a given direction. An observation optical microscope is composed of a pickup device 13, a display unit 16 such as a CRT, together with the reflecting mirror 12. The pickup device 13 receives light reflected from the reflecting mirror 12 and creates an optical microscope (OM) image from the light reflected from the specimen. The output video signal from the pickup device 13 is supplied to the display unit 16.

A scan coil 14 is supplied with a scan signal from a scan signal generator (SG) 15 mounted in the passage of the electron beam 2. The electron beam 2 is raster-scanned across a region 5a to be analyzed on the surface of the specimen 5 by the scan coil 14. As a result, secondary electrons are produced from the specimen surface. The secondary electrons are detected by a secondary electron detector 31. The output signal from the detector 31 is fed to the display unit 16 such as a CRT via a video amplifier 32.

Consequently, an SEM image or secondary electron image of the scanned region is displayed on the viewing screen of the CRT 16.

The specimen stage 7 comprises an x-motion motor 17 for moving the stage 7 in the x-direction, a y-motion motor 18 for moving the stage 7 in the y-direction, and a z-motion motor 19 for moving the stage 7 in the z-direction to adjust the height of the specimen stage 7. The x-motion motor 17 and the y-motion motor 18 are controlled by a stage controller 20. The z-motion motor 19 is controlled by a z-motion controller 21.

A position-specifying device 22 such as a joystick permitting the operator to move the specimen stage 7 at will is ancillary to the stage controller 20. A spectrometer controller 23 controls the analyzer element 9 and detector 11 of the x-ray spectrometer. A column controller 24 controls the various lenses of the electron optical system, as well as the components such as the scan signal generator 15 mounted inside the electron optical column. A control unit 25 consisting of a computer controls the x-y stage controller 20, the z-motion controller 21, the spectrometer controller 23, and the column controller 24.

The control unit 25 consisting of a computer comprises a division means 27 for dividing the analyzed region 5a into a given number of subregions, an automatic focusing control means 29, a memory 26 for storing the x-, y-, and z-coordinates of plural intersections inside the analyzed region 5a of the specimen 5, and an arithmetic means 30 for finding planes approximating the subregions from the measured heights of the intersections and calculating the heights, or z-coordinates, of the analysis points within each subregion.

In the above-described structure, it is assumed that an x-ray source (i.e., on which the electron beam impinges) $\alpha$ is located in a position P which is spaced a given distance of h from the objective lens along the optical axis. The analyzer element 9 and detector 11 are interlocked so that the focusing conditions are met at all times. That is, the x-ray source $\alpha$, the reflecting point $\beta$ on the analyzer element 9, and the detection point $\gamma$ on the detector 11 are arranged on the Rowland circle. Therefore, in order to make x-ray analysis with high sensitivity, it is necessary to place the analysis point on the specimen surface in the above-described position P. This operation is referred to as height setting.

The optical microscope has been previously set up in such a way that it is focused in the position P. Accordingly, when a new analysis is started, the operator observes the specimen surface with the optical microscope. The operator then moves the specimen stage upward or downward until the image of the analysis point is brought to a focus. Under this condition, the analysis point on the specimen 5 is located in the position P which is spaced the distance h from the objective lens.

After the height of the analysis point $\alpha$ on the specimen 5 is adjusted to h in this way, the electron beam 2 is directed at the analysis point. The x-rays 8 are emitted from this analysis point. The x-rays 8 are reflected as x-rays 10 of given wavelengths by the analyzer element 9. The x-rays 10 of the given wavelengths are detected by the detector 11. The analyzer element 9 is moved on the straight line L passing through both analysis point $\alpha$ and reflecting point $\beta$. Also, the detector 11 is moved along the Rowland circle according to the position of the analyzer element 9 while maintaining the distance between the analysis point $\alpha$ and analyzer element 9 equal to the distance between the analyzer element 9 and the detector 11. Thus, x-rays of different wavelengths are successively guided to the detector and detected. As a consequence, the kinds and amounts of chemical elements existing at the analysis point α can be known.

In this way, an x-ray analysis of one point is made. When a mapping analysis is made, the analysis point α is moved across the analyzed region by moving the specimen stage, and a measurement is repeatedly performed. Consequently, mapping data indicating the distribution of elements within the analyzed region can be obtained.

Where a plurality of analysis points α are established within the infinitesimally small analyzed region and measurements are made, if the surface of the analyzed region $5a$ is a flat and smooth plane on the surface of the specimen 5, then the height h of the analysis point α is kept constant. If the surface of the analyzed region $5a$ has steps or is uneven, the height of the specimen must be adjusted according to the unevenness so that the analysis point on the surface of the specimen is fixed at the position P that is spaced the distance h from the objective lens. However, this method involving establishing the height using the optical microscope for all of 1024×1024 points, for example, for a mapping analysis, is not practical to perform because an exorbitant number of operations and an exorbitantly long time are necessary.

Accordingly, in the present invention, even if the surface of the analyzed region $5a$ is not flat or smooth, the operation for measuring the height is performed not for all analysis points but for a limited number of analysis points. As a result, all the analysis points are brought into the optimum point, and accurate and high-sensitivity analysis is performed.

Figure 2A:
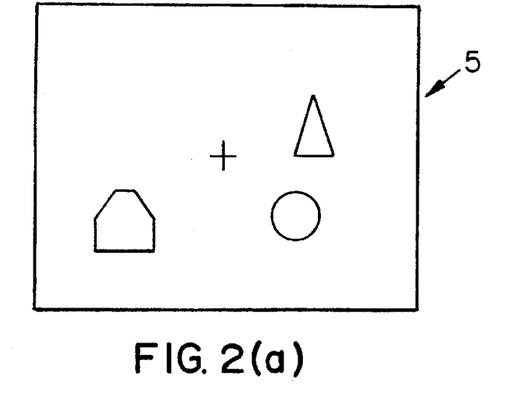
FIGS. 2(a)–2(c) are diagrams illustrating a process for establishing an analyzed region on a specimen surface by a method according to the invention.
Figure 2B:
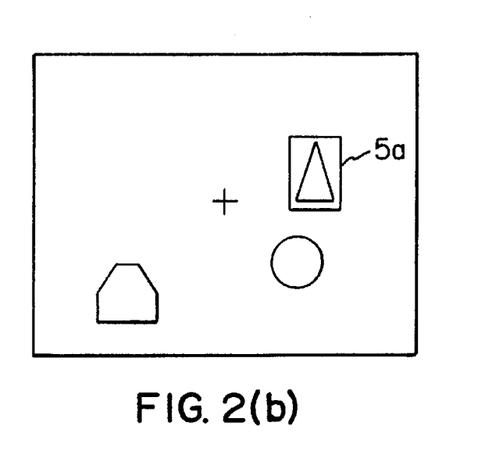
Figure 2C:
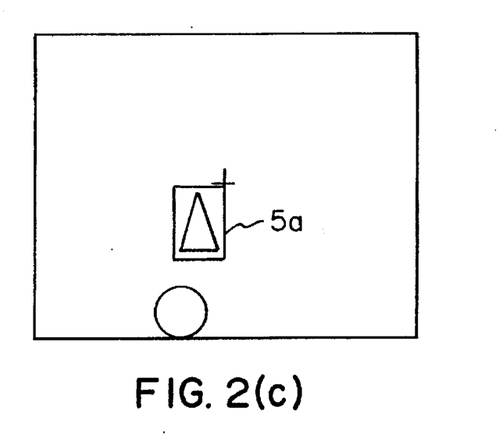

The operation for establishing or measuring the heights of a limited number of analysis points is described below. First, the operator observes an optical microscope (OM) image of the specimen, as shown in FIG. 2(a), presented on the CRT 16. The operator selects a rectangular region $5a$ to be analyzed, as shown in FIG. 2(b). The center of the crisscross cursor fixed at the center of the viewing screen of the CRT indicates the position on which the electron beam impinges, i.e., the analysis point. Then, the operator moves the specimen in such a manner that a reference position in the selected, analyzed rectangular region $5a$, for example the right upper corner, is located in the center of the crisscross cursor, as shown in FIG. 2(c). For this purpose, the position-specifying device 22 is operated so as to control the x-y stage controller 20 while watching the specimen image. The specimen stage 7 is moved within the x-y plane.

After the specimen is moved on the viewing screen of the CRT such that the reference point in the analyzed rectangular region $5a$ arrives in the center of the crisscross cursor in this way, the operator operates an entry device ancillary to the position-specifying device 22 or mounted independently to inform the division means 27 of the control unit 25 consisting of a computer that the point on the specimen located at the center, or the intersection, of the crisscross cursor is the reference point in the analyzed region. Corners other than the right upper corner can also be used as the reference point in specifying the rectangular region. Furthermore, the intersection of the two diagonal lines drawn across the rectangular region, or the center of the rectangular region, may also be used.

Figure 3A:
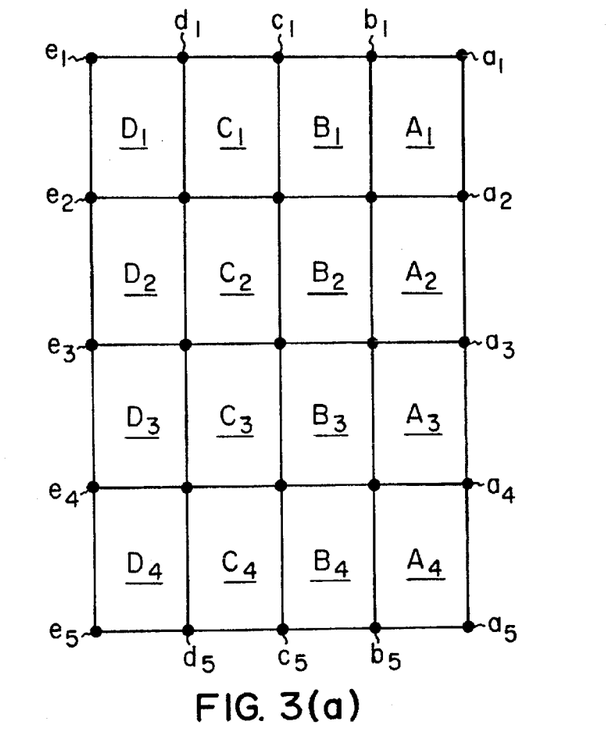
FIGS. 3(a) and 3(b) are diagrams illustrating the manner in which the analyzed region illustrated in FIGS. 2(a)–2(c) is divided into a given number of subregions.

The operator has previously set the horizontal length $\Delta x$ of each subregion, the vertical length $\Delta y$ of each subregion, the number of horizontal divisions $N_x$, and the number of vertical divisions $N_y$. It is assumed that the both numbers $N_x$ and $N_y$ are set to 4. The division means 27 sets the previously recognized reference point to $a_1$. The division means 27 divides the analyzed region $5a$ into 4×4 subregions, i.e., $A_1$–$A_4$, $B_1$–$B_4$, $C_1$–$C_4$, and $D_1$–$D_4$, as shown in FIG. 3(a), according to the horizontal length $\Delta x$, the vertical length $\Delta y$, the number of horizontal divisions $N_x$, and the number of vertical divisions $N_y$. As a result, the uneven analyzed region $5a$ is divided into 4×4 subregions each having the horizontal length $\Delta x$ and the vertical length $\Delta y$.

The area of each subregion can be made greater than the area of the analysis point. A plurality of analysis points, for example 128×128 analysis points, can be established within each subregion.

Data obtained by this division represent the x- and y-coordinates of the intersections of the division lines defining the subregions, i.e., the positions of the corners of the subregions $a_1$–$a_5$, $b_1$–$b_5$, $c_1$–$c_5$, $d_1$–$d_5$, and $e_1$,$e_5$. The data is stored in the memory 28 within the control unit 25.

After the operation for the division is completed in this way, the division means 27 successively reads data about the coordinates of the intersections from the memory 26 and sends the data to the stage controller 20. For example, if data about the coordinates of the intersection $a_1$ is first fed to the stage controller 20, the controller 20 moves the specimen stage 7 according to the data such that the intersection $a_1$ is placed on the optical axis, i.e., the stage 7 is illuminated with the electron beam. Then, the stage 7 is halted. Where the reference point used in recognizing the analyzed region $5a$ is the intersection $a_1$ the analyzed region $5a$ has been already placed on the optical axis such that the electron beam impinges on the region $5a$ by the aforementioned operation for recognizing the analyzed region $5a$. Hence, it is not necessary to make a further movement.

When the stage 7 is halted as described above, the operator operates the position-specifying device 22 so as to control the z-motion controller 21 while observing the optical microscope image of the specimen displayed on the CRT 16. Thus, the specimen stage 7 is moved in the z-direction. The center of the specimen image displayed on the CRT 16, i.e., the image at the position of the crisscross cursor (i.e., the image at the intersection $a_1$) is brought to a focus. Then, the operator operates the entry device ancillary to the position-specifying device 22 or mounted independently to inform the division means 27 of the control unit 25 that the focusing operation has been completed. The division means 27 then reads data about the z-coordinate, or height, of the specimen stage 7 from the z-motion controller 21 when the center of the specimen image is in focus. The data about the z-coordinate is stored in the memory 26, together with the data about the x- and y-coordinates of the intersection $a_1$. In this way, the height of the specimen stage for placing the intersection $a_1$ in the optimum height P is stored in the memory, along with the x- and y-coordinates of the intersection $a_1$. In the present embodiment, the optical microscope and the z-motion controller 21 together constitute the position-measuring means of the invention.

Similarly, in order that the division means send data about the x- and y-coordinates of the intersections $a_2$, . . . , $a_5$, $b_1$, . . . , $b_5$, . . . , $c_1$, . . . , $c_5$, $d_1$, . . . , $d_5$, $e_1$, . . . , $e_5$ to the stage controller successively, the intersections are successively placed in the position hit by the electron beam. Whenever the operator performs the focusing operation, the z-coordinate of the intersection is measured. The obtained z-coordinate is stored in the memory 26, together with the x- and y-coordinates of the intersection.

When the measurements of all the intersections are complete, the arithmetic means 30 of the control unit 25 calculates the z-coordinates of the numerous analysis points established in the subregions $A_1$, $A_2$, ..., $D_4$ from the z-coordinates of the intersections found by actual measurements. For example, the z-coordinates of the analysis points established within the subregion $A_1$ are computed from the x-, y-, and z-coordinates of the four intersections $a_1$, $a_2$, $b_1$, and $b_2$ surrounding the subregion $A_1$ and from the x- and y-coordinates of the analysis points. The found z-coordinates are stored in the memory 26 together with the x- and y-coordinates of the analysis points.

One example of the above-described computation is described now. Fundamentally, each subregion is approximated by a plane having a uniform gradient throughout the subregion. For instance, the x-, y-, and z-coordinates of the four intersections $a_1$, $a_2$, $b_1$, and $b_2$, defining the subregion $A_1$ are known. A plane at the shortest distance from these four points is calculated by an optimization method such as the least squares method. Then, data (x- and y-coordinates) about the positions of the analysis points within the subregion $A_1$ is substituted into a mathematical formula describing the determined plane. As a consequence, the z-coordinates of the analysis points on the plane $A_1$ can be found.

Figure 3B:
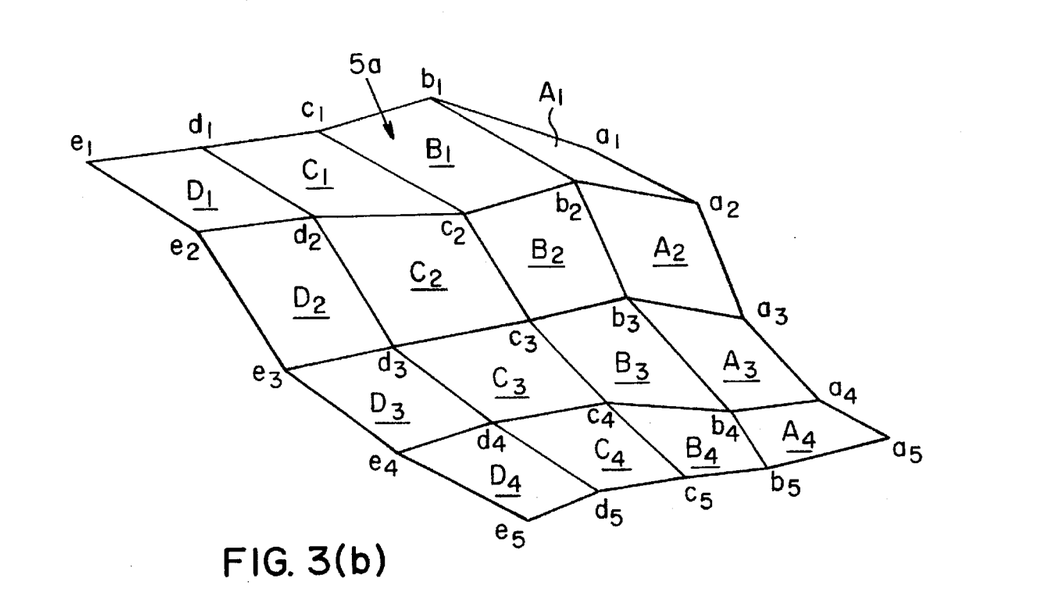

Similarly, planes approximating other subregions are determined from the x-, y-, and z-coordinates of the four intersections surrounding each subregion. Then, data (x- and y-coordinates) about the positions of the analysis points within each subregion is substituted into the mathematical formula describing the determined planes. As a consequence, the z-coordinates of the analysis points on the planes can be found. FIG. 3(b) illustrates a plane approximating each subregion determined in this way. Analysis points in each subregion are established on this plane.

If the analyzed region 5a of the specimen 5 is uneven as described above, the analyzed region is divided into subregions. It follows that the gradients of the subregions approximate the unevenness of the actual specimen surface. Therefore, the z-coordinates of the analysis points established in the subregions make it possible to bring the analysis points to the optimum height P almost precisely. If the analyzed region 5a is uneven, the z-coordinates permitting the height of the specimen stage to be established optimally according to the heights of the analysis points can be precisely determined.

The above-described manual operation for establishing the height, using the optical microscope, can be automated by imparting automatic focusing function to the optical microscope. In this case, the automatic focusing function is implemented by the automatic focusing control means 29 of the control unit 25. The operator selects the subregion 5a, i.e., specifies a reference point. Subsequent operations are all carried out automatically. Specifically, the focusing operation for the optical microscope at the intersections $a_1$–$a_5$, $b_1$–$b_5$, $c_1$–$c_5$, $d_1$–$d_5$, $e_1$–$e_5$ is automatically done by the automatic focusing control means 29 of the control unit 25 when it receives a video signal from the pickup device 13 of the optical microscope. This automatic focusing control means 29 has a function of judging whether the specimen is in focus, for example, by differentiating the video signal. When the heights of the intersections are measured, the automatic focusing control means 29 controls the z-motion controller 21 so that the height of the specimen is swept over a given range. During this sweeping operation, variations in the focused condition are monitored. In this way, the z-coordinate providing the optimum focused state is adopted as the z-coordinate of the intersection at this time. This operation is performed for the intersections successively.

In the description above, the height is established, using an optical microscope. The electron probe microanalyzer 1 obtains a scanning electron microscope (SEM) image by means of the scan coil 14 and secondary electron detector 31 as mentioned previously. The height-setting operation can be effected either manually or automatically, using this function. In this case, the focus of the scanning electron microscope (SEM) image is fixed at the optimum position P by appropriately adjusting the objective lens current. The operator controls the z-motion controller 21 while watching the SEM image displayed on the CRT 18. Thus, the image is brought to a focus.

Where the setting operation is automatically performed, if a video signal representing an SEM image is fed to the automatic focusing control means 29, a z-coordinate providing the optimum focused state can be found in exactly the same way as in the case of the optical microscope.

In this way, z-coordinates for placing the intersections defining the subregions in the optimum height P are measured. The calculational operation for finding the z-coordinates of numerous analysis points established in the subregions has been described already. A mapping analysis made according to information about heights found in this manner is described below.

The analyzed region 5a is divided into subregions $A_1$, $A_2$, ..., $A_4$, $B_1$, ..., $B_4$, $C_1$, ..., $C_4$, $D_1$, ..., $D_4$. These subregions are successively subjected to a mapping analysis. First, the control unit 25 reads data about the x-, y-, and z-coordinates of the first one of a plurality of analysis points established in the subregion $A_1$ from the memory 26. Data about the x- and y-coordinates is sent to the stage controller 20. Data about the z-coordinate is sent to the z-motion controller 21. As a result, the stage controller 20 moves the specimen 5 in the x- and y-directions according to the data about the and y-coordinates in such a way that the first analysis point in the subregion $A_1$ is brought into the position hit by the electron beam 2. The z-motion controller 21 moves the specimen stage 7 in the z-direction according to the data about the z-coordinate in such a manner that the first analysis point in the subregion $A_1$ is brought into the optimum position P. After the position of the first analyzed position has been established in this manner, the electron beam is emitted, and the spectrometer is swept to subject the first analysis point to an x-ray analysis.

Similarly, the position of the second analysis point in the subregion $A_1$ is established, and an x-ray analysis is made. After all the analysis points established in the subregion $A_1$ have undergone x-ray analysis, the adjacent subregion $A_2$ is subjected to a similar mapping analysis. Subsequently, the subregions $A_3$, ..., $D_4$ are subjected to a similar mapping analysis one after another. The results of the mapping analyses of the subregions $A_1$, ..., $D_4$ are combined together, taking account of the positional relation among the subregions. As a result, one composite mapping analysis result is obtained from the analyzed region 5a.

Even if the specimen surface is greatly uneven, i.e., the height is quite nonuniform, it is assured that each analysis point is placed in the optimum position and an analysis is made, by approximating the analyzed region 5a by subregions. In the above description, the z-coordinates of the analysis points have been previously calculated and stored in the memory together with their x- and y-coordinates. If the z-coordinate of each analysis point is computed after each measurement, then it is not necessary to store the z-coordinates of the analysis points in the memory.

Figure 4:
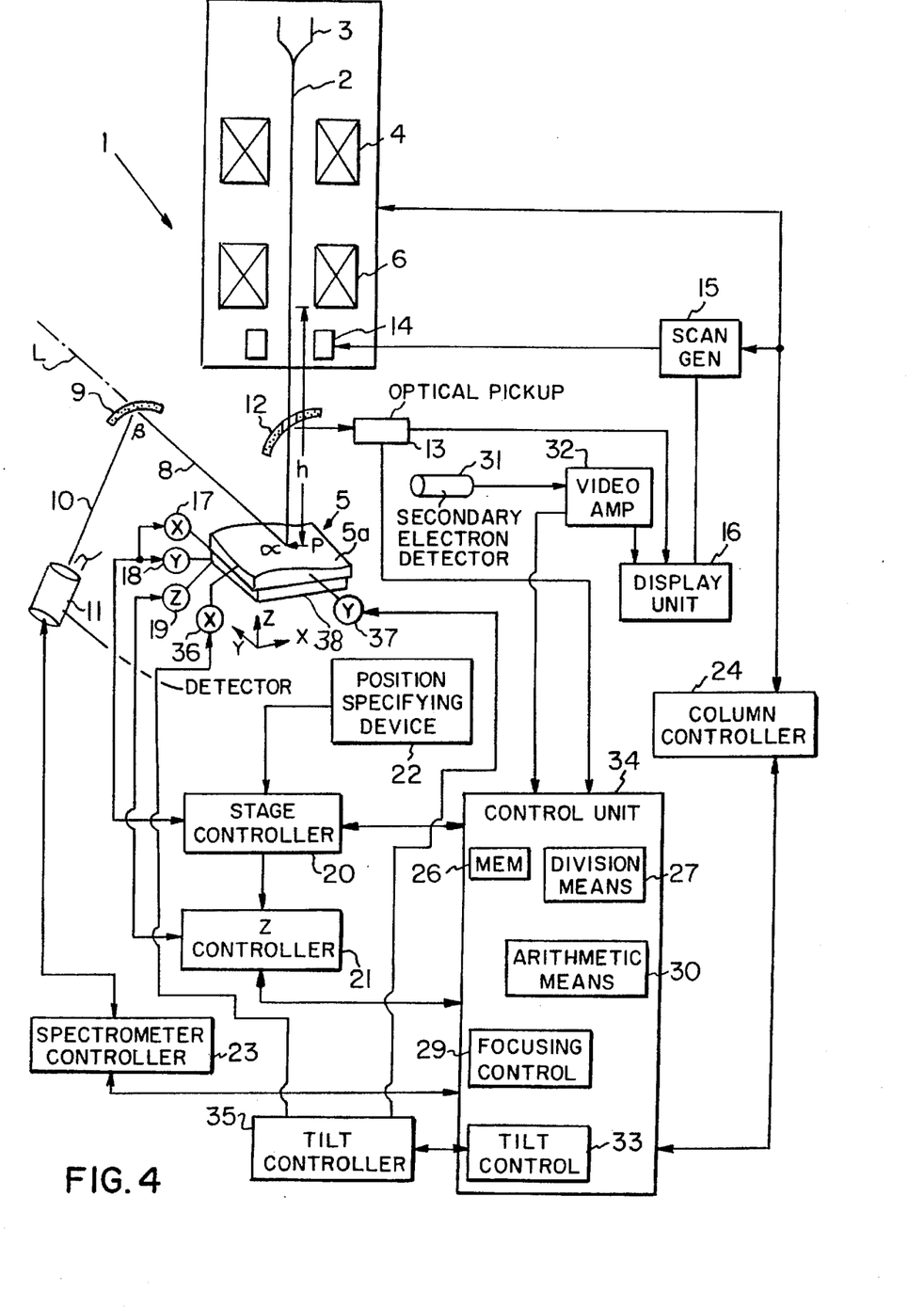
FIG. 4 is a schematic block diagram of another electron probe microanalyzer according to the invention.

Referring next to FIG. 4, there is shown another electron probe microanalyzer according to the invention. It is to be noted that like components are indicated by like reference numerals in various figures. The instrument shown in FIG. 4 is similar to the instrument shown in FIG. 1 except that a control unit 34 consisting of a computer, a tilt controller 35, an eucentric specimen-tilting stage 38, an x-tilt motor 36, and a y-tilt motor 37 are added. The control unit 34 incorporates a tilt control means 33 receiving information indicating the tilt of the plane of each subregion, the tilt being found by the arithmetic means 30. The eucentric specimen-tilting stage 38 is equipped with mechanisms for moving the specimen in the x-, y-, and z-directions. The eucentric specimen-tilting stage 38 also acts to tilt the specimen about the x- and y-axes passing through the optimum position P described above. The x-tilt motor 36 acts to tilt the specimen stage about the E-axis. The y-tilt motor 37 serves to tilt the specimen stage about the y-axis.

The apparatus shown in FIG. 4 is similar in operation to the apparatus shown in FIG. 1 except that tilts at analysis points are corrected. That is, the apparatus shown in FIG. 4 permits an operator to specify an analyzed region on a specimen surface. The specified analyzed region is divided into subregions. The z-coordinates of intersections defining the subregions are measured. Unit planes approximating the subregions are found from the found z-coordinates of the intersections. The z-coordinates of analysis points established on the unit planes are calculated and stored in a memory. Using the obtained results, mapping analysis is made in the manner described below.

Figure 5:
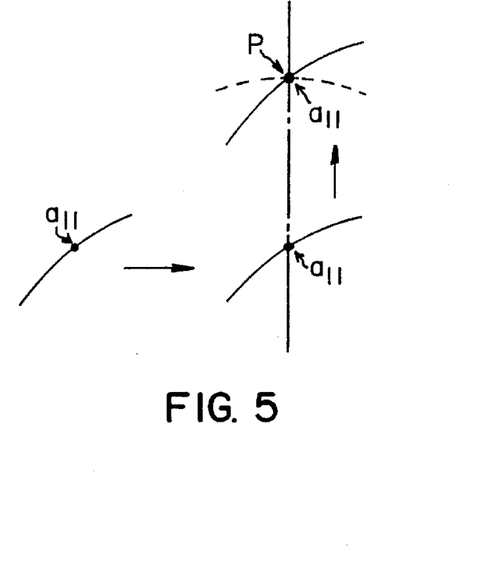
FIG. 5 is a schematic representation illustrating alignment operations performed by the apparatus shown in FIG. 4.

It is assumed that among the subregions, the inside of the subregion $A_1$ is to be analyzed first. The control unit 34 successively reads data about the x-, y-, and z-coordinates of the first one of a plurality of analysis points established in the subregion $A_1$ from the memory 26. Data about the x- and y-coordinates is sent to the stage controller 20. Data about the z-coordinate is sent to the z-motion controller 21. As a result, the stage controller 20 moves the specimen 5 in the x- and y-directions according to the data about the x- and y-coordinates in such a way that the first analysis point in the subregion $A_1$ is brought into the position hit by the electron beam 2. The z-motion controller 21 moves the specimen-tilting stage 38 in the z-direction, or up and down, according to the data about the z-coordinate in such a manner that the first analysis point in the subregion $A_1$ is brought into the optimum position P. As a result, the first analysis point $a_{11}$ in the subregion $A_1$ is brought into the optimum position P. This operation, or alignment, is illustrated in FIG. 5. In the embodiment described already in connection with FIG. 1, the electron beam is directed at the specimen, and the spectrometer is swept. Thereafter, the first analysis point is subjected to an x-ray analysis. In the present embodiment, the tilt of the specimen surface is adjusted prior to the x-ray analysis.

More specifically, as a result of the alignment described above, the analysis point is brought into the optimum position P, as can be seen from FIG. 5. The tilt of the specimen surface differs among different analysis points, but the direction in which x-rays are directed toward the spectrometer is fixed. This direction is referred to as the take-off direction. Therefore, the efficiency at which x-rays are detected may differ according to the direction of tilt of the specimen surface at each analysis point, though every analysis point is brought into the optimum position P.

Accordingly, in the present embodiment, tilt at each analysis point is corrected and removed. In particular, the specimen stage 38 is capable of tilting the specimen about the x- and y-axes passing through the optimum position. The stage 38 is tilted so as to cancel out the tilt of the specimen surface at each analysis point, as indicated by the broken line in FIG. 5. As a result, the tangent to each analysis point is maintained horizontal. Of course, every analysis point is placed in the optimum position P.

These tilt corrections are made by the tilt control means 33. For example, the tilt control means 33 finds the tilt or gradient of a unit plane approximating the subregion $A_1$ and tilts the specimen stage 38 in such a way that the tilt is canceled out and that this unit plane is placed horizontal. The first analysis point in the subregion $A_1$ is subjected to an x-ray analysis while retaining the tilt. Then, other analysis points in the subregion $A_1$ are successively subjected to an x-ray analysis. After completion of the analysis of the subregion $A_1$, the next subregion $A_2$ is subjected to a mapping analysis. Before this mapping analysis is performed, the specimen stage 38 is tilted so as to cancel out the tilt of the unit plane approximating the subregion $A_2$. With respect to the other subregions $A_3, \ldots, D_4$, the specimen stage 38 is tilted so as to cancel out the tilts of the unit planes approximating the subregions, and these subregions are successively subjected to a mapping analysis. The results of the mapping analyses of the subregions $A_1, \ldots, D_4$ are linked together by a computer. As a result, one composite mapping analysis result is obtained from the analyzed region 5a of the specimen 5. The result shows that a correct image is obtained by satisfying the x-ray focusing conditions, because every analysis point is placed in the optimum position P. Furthermore, x-rays are detected at a constant take-off angle for every analysis point and so the variations in the intensity of detected x-rays due to different directions of tilts of the analysis points are eliminated.

It is to be understood that the present invention is not limited to the foregoing embodiments and that various changes and modifications are possible. In the embodiment described already in conjunction with FIG. 1, the height of the specimen stage is adjusted while watching the optical microscope image or SEM image. Alternatively, the height of the specimen stage is adjusted by the automatic focusing control means according to a video signal representing the optical microscope image or SEM image. A function of measuring the height of the specimen can be imparted to the scanning electron microscope. Using this function, the z-coordinate of each intersection can be measured without moving the specimen in the z-direction.

For this purpose, the automatic focusing control means 29 shown in FIG. 1 may be designed to sweep the objective lens intensity rather than the specimen stage height. In addition, a function of judging whether the specimen is in focus according to the SEM video signal from the secondary electron detector 31 may be given to the focusing control means 29. Moreover, a function of converting the resulting objective lens current into a corresponding value of the distance between the objective lens and the specimen surface may be imparted to the focusing control means 29.

Figure 6:
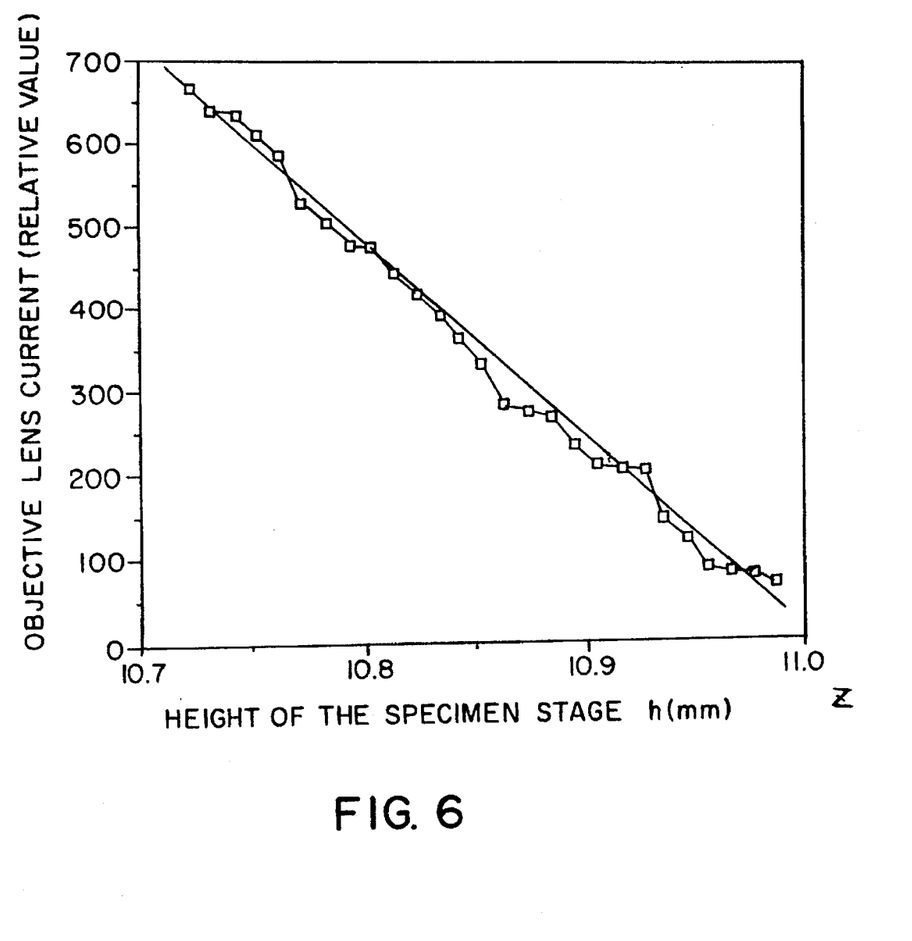
FIG. 6 is a graph illustrating a substantially proportional relation between the objective lens-focus distance and the objective lens current.

In this case, when the height is being measured, the automatic focusing control means 29 sweeps the objective lens current in steps to move the focus of the SEM in steps in the z-direction. At each value of the objective lens current, the SEM video signal from the secondary electron detector 31 is differentiated or otherwise processed to judge whether the specimen is in focus. In this manner, an objective lens current value providing the optimum focused condition is found.

Where the accelerating voltage and the electron beam current are kept constant, the distance between the objective lens and the focused position (specimen surface) has a nearly proportional relation to the objective lens current, as shown in FIG. 6. Therefore, this distance can be calculated by converting the objective lens current into a corresponding value by making use of the proportional relation shown in FIG. 6. The automatic focusing control means 29 has such a converting function.

Accordingly, the specimen stage is moved along the x- and y-axes while maintaining the height of the specimen stage at a reference height, i.e., at a given z-coordinate. The intersections are successively brought into the illuminated position. The automatic focusing control means 29 finds the distance for each intersection. Information about the found distance for each intersection, or z-coordinates, is stored in the memory 26. As a result, the z-coordinates of all intersections can be found. Subsequent operations using the found z-coordinates of the intersections are carried out in the same way as in the above-described embodiments and thus will not be described below.

As can be understood from the description provided thus far, the novel electron probe microanalyzer divides a region of a specimen to be analyzed into a given number-of subregions. Each subregion is approximated by a unit plane. Analysis points are established for these unit planes. Then, x-ray analyses are performed. Obtained sets of data are linked together such that the positions of the signal sources are aligned. Hence, even if the analyzed surface is uneven, the heights of the analysis points can be optimally set. Therefore, if the surface of the specimen is rough, has steps, or is tilted, high-sensitivity measurement is enabled by satisfying the focusing conditions for all the analysis points established on the surface.

What is claimed is:

1. A method of x-ray analysis, using an electron probe microanalyzer for directing an electron beam at a specimen and detecting characteristic x-rays emanating from said specimen by a spectrometer to make an elemental analysis of a surface of said specimen, said method comprising the steps of:

specifying a region to be analyzed on the surface of said specimen;

dividing the specified region into a plurality of subregions by division lines;

finding z-coordinates of intersections of said division lines;

storing the found z-coordinates in a memory, together with x- and y-coordinates of said intersections;

finding z-coordinates of a plurality of analysis points established within each of said subregions from the x-, y-, and z-coordinates of intersections surrounding said subregions and from x- and y-coordinates of said analysis points;

determining heights of said specimen from the found z-coordinates; and carrying out an x-ray analysis of each of said analysis points while substantially satisfying focusing conditions for said spectrometer.

2. The method of claim 1, further comprising the step of combining together sets of data, taking account of positions of said subregions, said sets of data being obtained by the x-ray analysis of each of said analysis points, thus obtaining composite x-ray analysis data.

3. The method of claim 1, wherein said step of finding z-coordinates of a plurality of analysis points established within each of said subregions from the x-, y-, and z-coordinates of said intersections consists of determining four intersections surrounding each of said subregions, finding x-, y-, and z-coordinates of said four intersections, determining a plane approximating each subregion from said x-, y-, and z-coordinates of said four intersections, and finding z-coordinates of the analysis points from the x- and y-coordinates of the analysis points on the determined planes approximating the subregions.

4. The method of claim 3, wherein said step of carrying out an x-ray analysis of each of said analysis points is performed at a given x-ray take-off angle for every analysis point by controlling tilt of said specimen according to information about tilts of the planes approximating the subregions.

5. The method of any one of claims 1–4, wherein said step of finding z-coordinates of intersections of the division lines defining said subregions is carried out, using an optical microscope.

6. The method of any one of claims 1–4, wherein said step of finding z-coordinates of intersections of the division lines defining said subregions is carried out, using a function of an electron scanning microscope incorporated in the electron probe microanalyzer.

7. An electron probe microanalyzer for directing an electron beam at a specimen and detecting characteristic x-rays emanating from the specimen by a spectrometer to make an elemental analysis of a surface of said specimen, said electron probe microanalyzer comprising:

an observation means for producing a visible image to a user to observe the surface of said specimen;

a position-specifying means permitting the user to specify a region to be analyzed on the specimen surface within the visible image produced by the observation means;

a division means for dividing the specified region into a plurality of subregions by division lines;

a height-measuring means for measuring heights, or z-coordinates, of a plurality of intersections created by said division lines;

a means for bringing said intersections successively into a position where the heights are measured by the height-measuring means;

a storage means for storing information about x- and y-coordinates of said intersections and information about the heights measured by the height-measuring means;

an arithmetic means for finding information about heights of analysis points from the information about positions heights of the intersections surrounding each subregion when an x-ray analysis is made of each of said analysis points established within each subregion; and a height-establishing means for establishing heights of the specimen according to the found z-coordinates and making an x-ray analysis of each of said analysis points while substantially satisfying focusing conditions for the spectrometer.

8. The electron probe microanalyzer of claim 7, further comprising means for combining together sets of data, taking account of positions of said subregions, said sets of data being obtained by the x-ray analysis of each of said analysis points, thus obtaining composite x-ray analysis data.

9. The electron probe microanalyzer of claim 7 or 8, wherein said height-measuring means for measuring heights of the intersections created by the division lines is composed of an optical microscope and said height-establishing means.

10. The electron probe microanalyzer of claim 7 or 8, wherein said height-measuring means for measuring heights of the intersections created by the division lines is a function of an electron scanning microscope incorporated in the electron probe microanalyzer.

11. The electron probe microanalyzer of any one of claims 7–8, wherein said arithmetic means determines planes approximating said subregions from x-, y-, and z-coordinates of four intersections surrounding each subregion and finds z-coordinates of the analysis points from x- and y-coordinates of the analysis points on the determined planes.

12. The electron probe microanalyzer of claim 11, further comprising a specimen tilt control means for controlling tilt of said specimen according to information about tilts of the planes determined by said arithmetic means, said specimen tilt control means making an x-ray analysis of each of said analysis points at a substantially constant x-ray take-off angle.

* * * * *

UNITED STATES PATENT AND TRADEMARK OFFICE
CERTIFICATE OF CORRECTION

PATENT NO. : 5,656,812
DATED : August 12, 1997
INVENTOR(S) : Hideyuki Takahashi

It is certified that error appears in the above-indentified patent and that said Letters Patent is hereby corrected as shown below: On the title page, insert:

Item: "[30] Foreign Application Priority Data]
Jul. 21, 1994    Japan..........7-185273"

Column 2 Line 50 "z-rays" should read --x-rays--.

Column 3 Line 8 "analysis,points" should read --analysis points--.

Column 6 Line 15 between "$e_1$" and "$e_5$" insert a hyphen  $e_1$-$e_5$

Column 6 Line 16 "memory 28" should read --memory 26--.

Column 8 Line 9 "CRT 18" should read --CRT 16--.

Column 8 Line 34 "the and  y  should read --the  x- and y-  --.

Column 9 Line 14 "E-axis" should read --x-axis--.

Column 9 Line 43 "$a_{11}$" should read --$a_1$--.

Column 10 Line 24 between "the" and "specimen" delete hyphen (-).

Column 11 Line 21 between "number" and "of" delete hyphen (-).

Signed and Sealed this

Thirtieth Day of December, 1997

Attest:

BRUCE LEHMAN

*Attesting Officer*     Commissioner of Patents and Trademarks